(12) United States Patent
Wakabayashi et al.

(10) Patent No.: US 6,194,816 B1
(45) Date of Patent: *Feb. 27, 2001

(54) PIEZOELECTRIC VIBRATOR

(75) Inventors: Hisao Wakabayashi, Tokorozawa; Hiroaki Takayanagi, Nagano; Toshinori Ide, Saku; Toshiya Hayashi, Nagano, all of (JP)

(73) Assignees: Miyota Co., Ltd., Nagano; Citizen Watch Co., Ltd., Tokyo, both of (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/101,813

(22) PCT Filed: Nov. 19, 1997

(86) PCT No.: PCT/JP97/04213

§ 371 Date: Jul. 17, 1998

§ 102(e) Date: Jul. 17, 1998

(87) PCT Pub. No.: WO99/06290

PCT Pub. Date: Feb. 11, 1999

(30) Foreign Application Priority Data

Nov. 19, 1996 (JP) ................................................. 8-324758
Nov. 20, 1996 (JP) ................................................. 8-326038
Dec. 5, 1996 (JP) ................................................. 8-342635

(51) Int. Cl.$^7$ ................................................. H01L 41/04
(52) U.S. Cl. ................................................. 310/348; 310/344
(58) Field of Search ................................................. 310/344, 348

(56) References Cited

U.S. PATENT DOCUMENTS 5,265,316 * 11/1993 Ikeda et al. ................................. 29/25.35
5,392,006 * 2/1995 Ikeda et al. ................................. 331/158
5,607,236 * 3/1997 Takagi et al. ................................. 374/117
5,773,914 * 6/1998 Gottier ................................. 310/344

FOREIGN PATENT DOCUMENTS

| 51-133748 | 10/1976 | (JP) . |
| 61-247775 | 11/1986 | (JP) . |
| 63-20618 | 2/1988 | (JP) . |
| 1-062909 | 3/1989 | (JP) . |
| 1-068007 | 3/1989 | (JP) . |
| 64-35736 | 3/1989 | (JP) . |
| 3-060505 | 3/1991 | (JP) . |
| 4-078211 | 3/1992 | (JP) . |
| 4-196611 | 7/1992 | (JP) . |
| 6-074834 | 3/1994 | (JP) . |
| 7-14132 | 2/1995 | (JP) . |

* cited by examiner

*Primary Examiner*—Nestor Ramirez
*Assistant Examiner*—Peter Medley
(74) *Attorney, Agent, or Firm*—Dickstein Shapiro Morin & Oshinsky LLP

(57) ABSTRACT

A base (10) has a substantially cylindrical plug (12) penetrated by two leads 14. A piezoelectric oscillator (24) is secured to and supported on ends of the two leads by supports (26). The supports (26) are formed from solder having as high lead content of more than 60% by weight, preferably 85 to 98% by weight. A cap (28) open at one end is fitted on the piezoelectric oscillator (24). The plug (12) seals the open end of the cap (28) and forms a gas-tight casing, thus forming a piezoelectric oscillator unit with piezoelectric oscillator (24) held gas-tight in the inside. The high lead content solder is soft and has a low Young's Modulus, so that it can disperse stress when the piezoelectric oscillator experiences. It is thus possible to evade stress concentration on the piezoelectric oscillator (24) and improve shock resistance. A layer of a solder with a lead content of 60% by weight or less or of tin or a tin alloy, is formed on the surface of the leads (14), and ensures solder wetting property.

10 Claims, 6 Drawing Sheets

PIEZOELECTRIC VIBRATOR

TECHNICAL FIELD

The present invention relates to piezoelectric oscillator units of a type having a gas-tight casing, in which a piezoelectric oscillator such as a quartz oscillator is sealed, as well as such gas-tight casings, and more particularly, to the structure and method of manufacture of such piezoelectric oscillator unit.

BACKGROUND ART

A piezoelectric oscillator which comprises a piezoelectric oscillator sealed in a gas-tight casing and leads connected at one end to the piezoelectric oscillator and having other end portions extending to the outside of the gas-tight casing, is a well known art. The piezoelectric oscillator employed may be a tuning-fork oscillator, a rectangular AT cut oscillator, etc. The gas-tight casing is formed by a substantially cylindrical cap open at one end and a plug having an outer shape capable of being pressure fitted in the inner surface of the open end of the cap, the plug being pressure fitted therein. The cap is formed from Kovar or german silver. The plug comprises a glass body and a metal ring fitted on the periphery of the glass body, and it is penetrated by a plurality of leads of Kovar or like material. The piezoelectric oscillator is coupled by solder of ends of the leads, and is thus supported by the ends thereof. The piezoelectric oscillator is accommodated gas-tightly by pressure fitting the plug in the cap as noted above. The plug thus serves as a gas-tight sealer terminal which seals the piezoelectric oscillator and is connected to external circuitry.

The above piezoelectric oscillator unit is normally manufactured as follows. First, the inner periphery of the open end of the gap, the outer periphery of the plug and the leads are plated with an eutectic solder. Then, paste of a mixture of the eutectic solder and a flux is supplied to portions of the leads that are to extend into the inside of the gas-tight casing, and surface electrodes of the piezoelectric oscillator, formed on the surface thereof, are held in contact with the portions supplied with the paste. The solder paste is then thermally fused to secure the piezoelectric oscillator to the plug. In this way, the piezoelectric oscillator unit is obtained. By plating the outer periphery portion of the plug and the inner periphery portion of the cap with the soft metal solder, the play between these portions can be filled and sealed when the plug is pressure fitted. In addition, by plating the leads with solder, the property of soldering between the surface electrodes of the piezoelectric oscillator and the external circuitry can be improved. By the term "eutectic solder" is meant solder with a tin content of 62 percent by weight, the remainder being lead. In the following description, solders with lead contents of 60 percent by weight or less, inclusive of the eutectic solder, are referred to as low temperature solder. The remainder of the low temperature solder composition other than lead is entirely or mostly tin, and may contain 2 to 3% of an additive such as silver. The melting point of low temperature solder is below 232° C. the melting point of tin.

With the piezoelectric oscillator unit having the structure as described above, the heat resistance is a very important requirement depending on applications. For example, in an application as an element of an SMD (surface-mounted device) on a circuit substrate, reflow of solder is done for the purpose of mounting after sealing. In such a case, it is required that the reflow can be done with possibility of neither gas-tightness failure of the seal portions nor melting of the mounted portion of the piezoelectric oscillator as a result of heating at 240° C. for about 5 seconds (or at 260° C. for 10 seconds or above). The low temperature solder may be used relatively safely for these portions because the cap provides enough mechanical tightening effect for the seal portions to maintain gas tightness so long as the reflow condition is a relatively low temperature or a relatively short period of time. The reflow condition of a relatively low temperature or a relatively short period of time, however, may not effect fusion of the solder in the mounting portion due to the heat capacity thereof. In such a case, the low temperature solder is no longer safe or sufficient heat resistance may not be ensured, depending on the setting of reflow conditions by the user.

In order to improve the heat resistance of the piezoelectric oscillator, the use high lead content solder has been proposed. For example, Japanese Laid-Open Patent Publication No. Sho 64-68007 proposes the use of high temperature solder for both piezoelectric oscillator mount portion and plug/gap seal portions. According to this literature, by the term "high temperature solder" is meant solder with a melting point between 260 and 370° C. and a Sn:Pb ratio of 1:9. Japanese Laid-Open Patent Publication No. Sho 64-62909 proposes forming a lead type layer of a lead alloy only on the outer periphery of a metal ring constituting a plug and, if necessary, forming a silver plating layer on the lead type plating layer for suppressing generation of lead vapor during heating.

Another problem which should be taken into considerations is the shock resistance. Recently, quartz oscillators are finding increasingly extensive applications to portable telephone sets and other portable units to be held with a hand in use, and these applications are producing increasingly stringent market demand for the shock resistance. For example, a unit may need to withstand being dropped several times on a wood plate from a height of 100 to 150 cm.

Several proposals have also been made regarding shock resistance. Japanese Laid-Open Patent Publication No. Sho 61-247775 proposes a technique wherein a quartz oscillator piece is secured to and supported on a plug with a photosensitive adhesive with ashore hardness of 90 or below in D scale. Japanese Laid-Open Patent Publication No. Hei 4-78211 proposes mounting additional leads of a material with a Young's modulus of $5.0\times10$ GPa or below to short inner lead sand bonding a quartz oscillator piece to the other ends of the additional leads. In an embodiment of this invention, the additional leads are formed from a solder with a Young's modulus of $1.95\times10$ GPa and have a short plate-like shape. Japanese Patent Publication No. Hei 7-14132 proposes bonding and securing quartz oscillator electrodes and lead conductor supports leading to external circuitry an adhesive, which contains epoxy resin, polybutadiene resin, petroleum type resin and conductive particles and is flexible.

In many cases where the shock resistance requirement is not so stringent, low temperature solder paste is used to support the piezoelectric oscillator. In such cases, by fast heating to secure the piezoelectric oscillator to the plug, very small solder particles called solder balls or solder spatter are spattered and remain inside the casing or attached to the piezoelectric oscillator, giving rise to yield reduction problems such as defective CI (crystal impedance) and defective oscillation at low drive levels.

Specific problems posed in the above described art will now be considered. According to the techniques proposed in Japanese Laid-Open Patent Publication No. Sho 64-68007 and Japanese Laid-Open Patent Publication No. Sho 64-62909, the plug outer periphery metal ring and the lead portions extending to the inside and outside of the gas-tight sealer casing (hereinafter referred to as inner and outer leads, respectively) are plated with high temperature solder by plating in the usual manner. Alloys with high lead contents tend to form a strong oxide film on their surface, making it difficult to obtain soldering when mounting the piezoelectric oscillator on an external circuitry substrate. This is so because the soldering has to be carried out at such a low temperature as to cause no damage to other parts using low temperature solder. For this reason, the outer leads should be stripped off the high temperature solder and dipped in a low temperature solder bath, thus increasing the number of steps and cost of manufacture. Also, the solder layer formed by the dipping lacks uniformity in thickness, possibly making it difficult to bend the outer leads and deteriorating the mounting property due to fluctuations of its amount. The outer leads are bent when surface mounting the piezoelectric oscillator. When surface mounting the piezoelectric oscillator, the peripheral surface of the cap and the ends of the outer leads should be held in close contact with circuitry substrate surface. To attain this, the outer leads should be bent just like a crankshaft such that their height is aligned to the peripheral surface of the cap.

Japanese Laid-Open Patent Publication No. Sho 64-62909, teaches that high lead content alloys generate lead vapor when heated, and that by carrying out reflow when mounting the piezoelectric oscillator, lead is attached thereto achieve a frequency shift. In this connection, the literature teaches that it is inevitable to adopt a partial plating process taking a large number of steps in order to prevent the high temperature solder from attaching to other portions of the plug outer periphery and the cap inner periphery than the pressure fitting portions. However, we have a different opinion in this respect, that is, lead generates only a negligible amount of vapor because the partial vapor pressure of lead is very low at, for instance, 150° C. Although the vapor pressure is slightly higher at 260° C., it poses substantially no problem, because the heating is completed in a short period of time. Thus, substantially no problem arises unless the low temperature solder inside the casing is fused (particularly in large surface area portions) after sealing.

Japanese Laid-Open Patent Publication No. Sho 64-62909 also teaches that silver plating the surface layer improves the soldering property. However, since silver is expensive, it is usually layered to only a very small thickness (i.e., flush plating or the order of 0.1 to 0.2 $\mu$m). Therefore, in a bent lead portion the silver layer is broken to expose the underlying high temperature solder and deteriorate the soldering property. Once the piezoelectric oscillator is mounted, silver is lost in the substrate solder, thus disabling the remounting, that is, making it impossible to reuse parts recovered from external circuitry substrates no longer used.

Regarding the shock resistance improvement, the adhesives used in the techniques proposed in Japanese Laid-Open Patent Publication No. Sho 61-247775 and Japanese Patent Publication No. Hei 7-14132, have problems related to control, hardening, step and reliability. For example, although solder mounting can be made such that fused solder is spread to accurately follow the piezoelectric oscillator surface electrode pattern shape, the spreading of non-hardened, i.e., liquid-phase, adhesive can not be regulated, thus giving rise to fluctuations of the bonding position and causing fluctuations of the CI and the bonding strength. According to the techniques proposed in Japanese Laid-Open Patent Publication No. Hei 4-76211, the mounting of the piezoelectric oscillator by the agency of the small-size additional leads, increased the length of the leads and the total length of the piezoelectric oscillator. Besides, the bonding two different kinds of leads is very inferior in operation control property, and not suited for mass production.

DISCLOSURE OF THE INVENTION

It is an object of the present invention to provide a piezoelectric oscillator unit which can solve the problems discussed above, that is, which can harmonize opposite performances at high level and realizes improvement in the heat resistance and shock resistance while taking the mounting property and mass production property into considerations.

To attain the above object, one form of the piezoelectric oscillator unit according to the present invention comprises a piezoelectric oscillator, a cap having a substantially cylindrical shape open at one end, for accommodating the piezoelectric oscillator, a gas-tight sealer terminal sealing the open end of the cap and forming a gas-tight sealing together with the cap, the gas-tight sealer terminal including a plug having substantially the same cross-sectional profile as the inner diameter of the open end of the cap, and a plurality of leads penetrating the plug, and supports formed from solder with a lead content between 85 and 98 percent by weight, for bonding and securing the piezoelectric oscillator to inner leads as portions of the leads extending into the gas-tight sealer terminal.

With this construction, the piezoelectric oscillator is supported by the supports formed from solder with a high lead content, i.e., soft solder. Since the supports are soft, when the piezoelectric oscillator experiences an external force, the supports can flex and disperse the stress. Thus, stress concentration on the piezoelectric oscillator can be suppressed to improve the shock resistance. In addition, since the solder with the above lead content belongs to the high temperature solder and has a high melting point, it reliably supports the piezoelectric oscillator even under a high temperature condition.

The leads comprise a first layer formed from solder with a lead content of 60 percent by weight or (i.e., low temperature solder) or from tin or a tin alloy, on them, particularly on their portions extending from the plug. The low temperature solder or the like has good wetting property. Thus, the solder supplied for mounting the unit or surface mounting the piezoelectric oscillator becomes very intimate with the lead surface, and permits reliable soldering. In addition, this type is inexpensive, and it is thus possible to form the first layer with a sufficient thickness, for instance 5 to 10 $\mu$m, so that the first layer thus formed is not broken when the leads are bent, which also helps insure reliable soldering.

The plug has a second layer formed from solder with a Lead content of 60 percent by weight or less (i.e., low temperature solder) or from tin or a tin alloy, on it. The second layer is preferably formed simultaneously with the first layer.

The plug may further have a third layer formed from solder with a lead content of more than 60 percent by weight, underlying the first layer. This third layer ensures freedom from rupture of the gas tightness of the piezoelectric oscillator. For example, it is possible to sufficiently withstand heating by the reflow of solder when mounting the piezoelectric oscillator. In addition, when pressure fitting the plug in the pen end of the cap, the soft, high temperature solder is deformed and acts to fill the play, thus permitting reliable sealing. Particularly when pressure fitting the plug in the cap, the first layer is partly ground off. Thus, the heat resistance is not substantially reduced by the first layer of the low temperature solder.

The leads preferably have a fourth layer formed from solder with a lead content of more than 60 percent by weight, underlying the second layer. Again the fourth layer is preferably formed simultaneously with the third layer.

Another form of the piezoelectric oscillator unit according to the present invention comprises a piezoelectric oscillator, a cap having a substantially cylindrical shape open at one end for accommodating the piezoelectric oscillator, a gas-tight sealer terminal sealing the open end of the cap and forming a gas-tight casing together with the cap, the gas-tight terminal including a plug having substantially the same cross-sectional profile as the inner diameter of the open end of the cap and having a layer formed from solder with a lead content of more than 60 percent by weight, on a portion in contact with the inner surface of the open end of the cap, and a plurality of leads penetrating the plug having a layer formed from solder with a lead content of 60 percent by weight or less or from tin or a tin alloy, on portions extending from the plug, and supports formed from solder with a lead content between 85 and 98 percent by weight, for bonding and securing the piezoelectric oscillator to inner portions of the leads extending into the gas-tight casing.

With this construction, the piezoelectric oscillator is supported by the supports formed from solder with a high lead content, i.e., soft solder. Since the supports are soft, when the piezoelectric oscillator experiences an external force, the supports can flex and disperse stress. Thus, the stress concentration on the piezoelectric oscillator can be reduced to thereby improve the shock resistance. In addition, since the solder with the above lead content belongs to high temperature solder and has a high melting point, it reliably supports the piezoelectric oscillator even under a high temperature condition.

Furthermore, the layer formed from solder with a lead content of more than 60 percent by weight, i.e., high temperature solder, on a portion of the plug in contact with the inner periphery of the open end of the cap, ensures freedom from destruction of the gas tightness of the piezoelectric oscillator even under a high temperature condition. For example, it is possible to sufficiently withstand heating by the reflow of solder when mounting the piezoelectric oscillator. In addition, when pressure fitting the plug in the open end of the cap, the soft, high temperature solder is deformed and acts to fill the play, thus permitting reliable sealing.

Moreover, the leads have a layer of low temperature solder or the like formed on them, particularly on their portions extending from the plug. Since low temperature solder or the like has good wetting property, the solder supplied form mounting or surface mounting the piezoelectric oscillator becomes intimate with the lead surface very well, and permits reliable soldering. In addition, the solder is usually an inexpensive material, and it is thus possible to form the first layer from the low temperature solder, for instance, with a sufficient thickness, for instance 5 to 6 $\mu$m. The first layer thus formed is not broken when the leads are bent, and guarantees reliable soldering in this respect as well.

The tin alloy noted above may contain 3% or less, and preferably 2 to 3% silver.

The supports may substantially cover the inner leads and have extensions extending from ends of the leads toward the gravitational center of the piezoelectric oscillator and having a length greater than one half the diameter of the leads. In such form, the supports can reliably secure the piezoelectric oscillator.

Where the plug has a high temperature solder layer such as the third layer noted above formed on it, the cap may be formed from a relatively hard metal, such as a copper-nickel alloy, because the high temperature solder is soft and becomes very intimate with the cap, even through the cap is hard. Copper-nickel layer has high heat resistance and is suitable from the standpoint of the heat resistance improvement of the piezoelectric oscillator. It is also suitable to form the cap from a metal other than copper-nickel type alloys and form a nickel layer on the surface of such cap body.

A further form of the present invention is a gas-tight sealer terminal having a substantially cylindrical shape open at one end and sealing an open end of a cap accommodating an electric element, the gas-tight sealer terminal comprising a plug having substantially the same cross-sectional profile as the inner diameter of the open end of the cap and having a first layer formed from solder with a lead content of 60 percent by weight or less or from tin or a tin alloy, on a portion in contact with the inner surface of the end of the cap, and a plurality of leads penetrating the plug and having a second layer formed from solder with a lead content of 60 percent by weight or less or from tin or a tin alloy on portions extending from the plug, the plug having a third layer formed form solder with a lead content of more than 60 percent by weight, underlying the first layer, the leads having a fourth layer formed from solder with a lead content of more than 60 percent by weight, underlying the second layer.

A still further form of the present invention is a method of manufacturing a piezoelectric oscillator unit having a piezoelectric oscillator accommodated in a gas-tight casing formed by a cap and a gas-tight sealer terminal, comprising the steps of securing the piezoelectric oscillator to the gas-tight sealer terminal by coupling leads of the gas-tight sealer terminal and electrode films of the piezoelectric oscillator to one another with solder with a lead content of 88 percent by weight or more, supplied to between the leads and the electrode films, and accommodating the piezoelectric oscillator in the cap and sealing the cap with the gas-tight sealer terminal. With this lead content, it is possible to ensure a lead content of 85% after the securing of the piezoelectric oscillator, even in a case where the leads are plated with low lead content solder.

It is possible to provide, prior to the step of securing the piezoelectric oscillator, a step of plating the leads with solder with a lead content of more than 60 percent by weight.

It is also possible to provide, prior to the step of securing the piezoelectric oscillator, a first plating step of plating the gas-tight sealer terminal with solder with a lead content of 60 percent by weight or less, and a subsequent second plating step of plating the gas-tight sealer terminal with solder with a lead content of more than 60 percent by weight.

In the step of securing the piezoelectric oscillator, the leads and the electrode films are coupled to one another by supplying solder with a lead content between 85 and 98 percent by weight.

The step of securing the piezoelectric oscillator may be carried out such that the volume of the solder coupling the leads and the electrode films to one another is more than twice the volume of the solder plating portions of the leads inside the gas-tight sealer casing. With this volume ratio, it is possible to ensure a lead content of 85% after the securing of the piezoelectric oscillator, even in a case where the leads, are for instance, plated with low lead content solder.

The step of securing the piezoelectric oscillator may also be carried out such that the volume of the solder coupling the leads and the electrode films to one another is above the volume of portions of the leads within the gas-tight casing. With this volume arrangement, it is possible to reliably secure the piezoelectric oscillator.

It is further possible to provide, prior to the step of securing the piezoelectric oscillator, a heat treatment step carried out at a temperature between 80 and 140° C. for a period between 1 and 5 days. By this step, quartz grains of the solder of the supports supporting the piezoelectric oscillator are grown to reduce the Young's modulus of these supports. These supports thus become softer and more able to disperse stress.

BEST MODE FOR CARRYING OUT THE INVENTION

Figure 1:
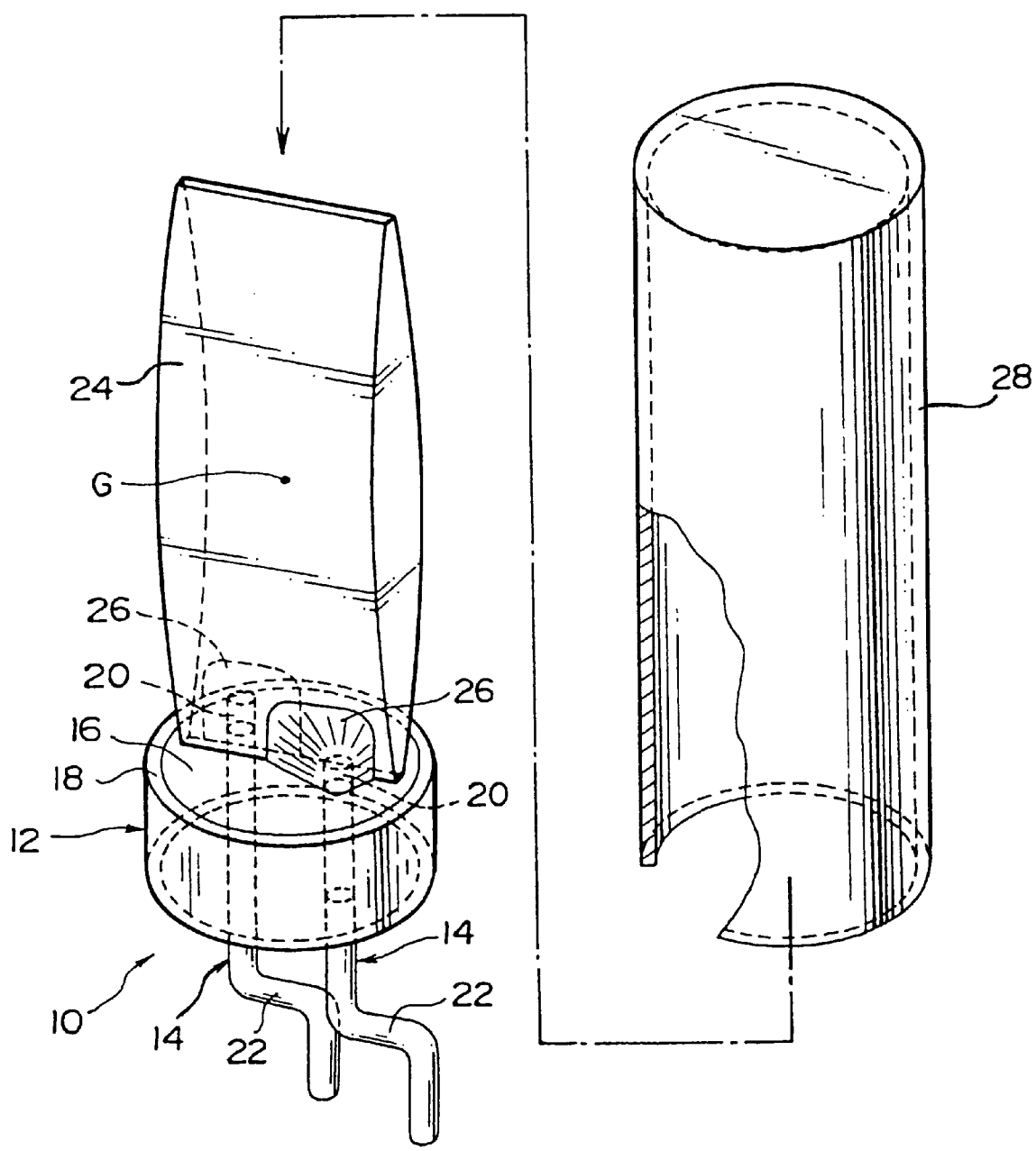
FIG. 1 is an exploded perspective view showing an embodiment of the present invention.

Embodiments of the present invention will now be described with reference to the drawings. FIG. 1 is a perspective view showing the structure of a first embodiment of the present invention. Reference numeral 10 designates a terminal base,which includes a substantially cylindrical plug 12 and two leads 14 penetrating the plug 12 in axial direction thereof. The plug 12 includes a substantially cylindrical sealing glass body 16 and a metal ring 18 of Kovar provided on the outer periphery of the periphery of the glass body 16. The two Leads 14 penetrating the sealing glass body 16 have inner and outer leads 20 and 22 extending from the glass body 16. The inner leads 20 of the leads 14 extend into the inside of a gas-tight casing. In FIG. 1, the inner leads 20 project upward from the plug 12. The inner leads 20 project for a small length; in this embodiment the projection length is 0.3 mm which is the diameter of the leads 14. The outer leads of the leads 14 extend to the outside of the gas-tight casing. In FIG. 1, the outer leads 22 project downward from the plug 12. The outer leads 22 are bent like a crank, and are thus suitable for surface mounting.

Reference numeral 24 designates a piezoelectric oscillator, which is a convex type quartz oscillator having oscillation electrode films (not shown) formed on its front and rear surfaces. The piezoelectric oscillator 24 may not be of the convex type; for instance, it is possible to use a rectangular AT cut. The piezoelectric oscillator 24 is disposed between the two inner leads 20 with its long axis aligned to the axis of the plug 12. The two inner leads 20 are coupled by supports 26 formed from solder to one end of the oscillation electrode films provided on the front and rear surfaces of the piezoelectric oscillation 24.

Reference numeral 28 designates a cap having a substantially cylindrical shape open at one end. The open end of the cap 28 has an inner diameter slightly smaller than the outer periphery of the plug 12. The cap 28 covers on the piezoelectric oscillator 24 and is fitted on the plug 12 from above in FIG. 1 in vacuum. The cap 28 is pressure fitted on the plug 12 to be sealed thereby with its inside in vacuum. Thus, the gas-tight casing is formed.

Figure 2:
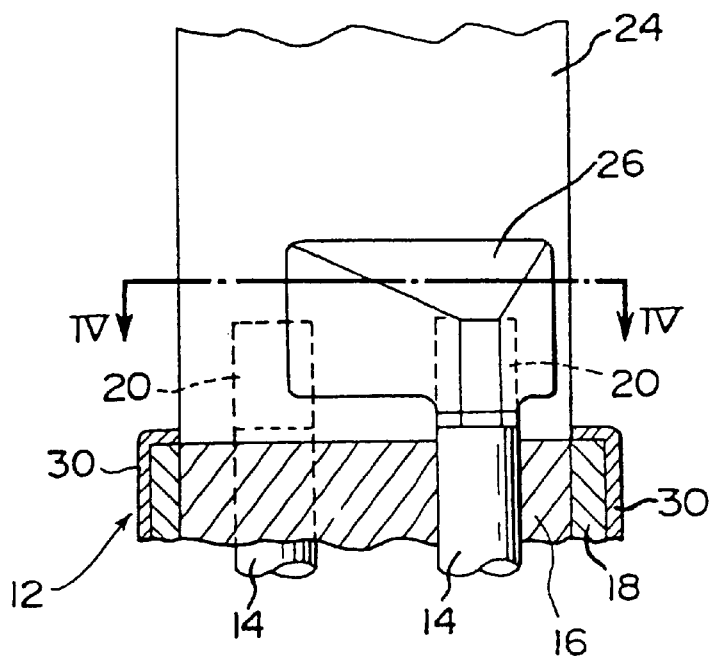
FIG. 2 is a fragmentary enlarged-scale front view, partly in section, showing a support 26.
Figure 3:
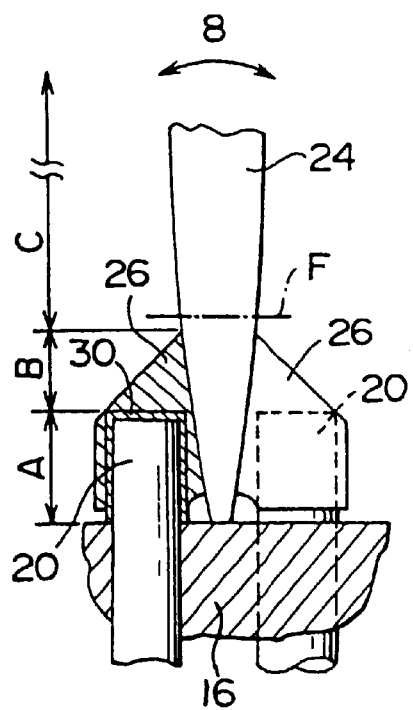
FIG. 3 is a fragmentary enlarged-scale side view, partly in section, showing supports 26.
Figure 4:
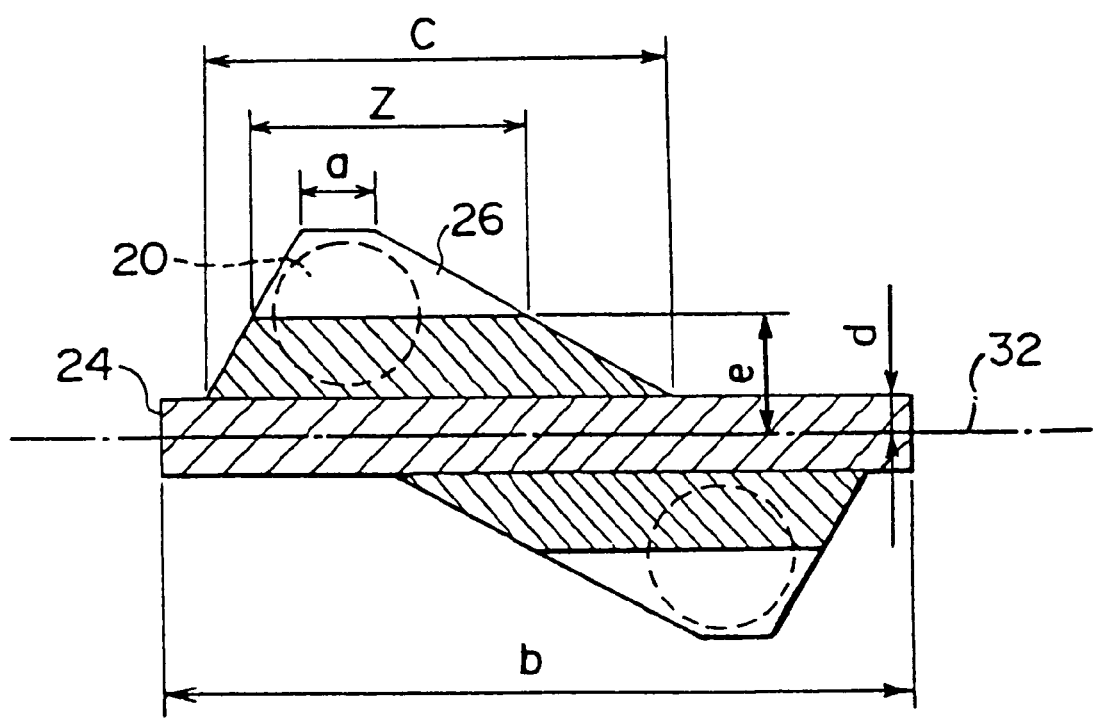
FIG. 4 is a sectional view showing the supports 26.

FIGS. 2 to 4 show details of coupled portions of the piezoelectric oscillator 24 and the terminal base 10 in this embodiment. Since the piezoelectric oscillator 24 in this embodiment of the piezoelectric oscillator unit is cantilever supported as shown in, for instance, FIG. 1, when an external force tending to bend it is exerted to it, stress is concentrated in the stem of its supported portion. Therefore, when an excessive external force is exerted to it, such as by dropping, the piezoelectric oscillator 24 is broken at a position shown by chain line F in FIG. 3. In order to prevent such breakage, in this embodiment the supports 26 are formed from a soft material, i.e., a material with a low Young's modulus, so that the supports 26 can disperse stress. Specifically, they are preferably formed form high temperature solder with a lead content between 85 and 95 percent by weight (hereinafter referred to as wt. %, preferably 90 wt. % or more, the remainder being tin. With high lead content, the material is soft, and can disperse stress.

The surface of the terminal base 10, i.e., the surfaces of the metal ring 18 of the plug 12 and the leads 14, is first plated with a solder layer 30 with a thickness of about 15 μm. The solder layer 30 is suitably formed from low temperature solder with a lead content of 60 wt. % or less, preferably about 40 wt. % or less which is a composition near the eutectic point. The solder layer 30 may also be a layer plated with tin containing no lead or a tin alloy slightly containing silver.

With a lead content in excess of 40 wt. %, such drawbacks as unsatisfactory soldering property, damage readily caused because the solder is soft, an aesthetically unpleasant blackish color, difficulty plating liquid composition management, etc. become pronounced.

The soldering of the supports is done as follows. The terminal base 12 having been plated with low temperature solder (i.e., eutectic solder) is set upright on a processing table. Then, a metal screen which has holes corresponding to the heads of the inner leads 20 so that paste can be applied only to the areas in the holes is overlapped over the terminal base 20. Next, a solder paste having a desired viscosity which has been prepared by kneading together fine spherical particles of high temperature solder and a rosinm type flux is applied by printing to the terminal base 12. Thus, the paste is attached in adequate amounts around the inner leads 20. There after, the piezoelectric oscillator 24 is inserted into the space between the inner leads 20 such that its electrode films touch and are wetted by paste droplets. The system in this state is then passed through a reflow furnace at a temperature above the melting point of the high temperature solder. In this way, the connection of the electrode films of the piezoelectric oscillator 24 to the solder and the support and securing of the piezoelectric oscillator are completed. In this state, the lower end of the piezoelectric oscillator 24 is substantially in contact with the top surface of the terminal base 12. Thus, the completed piezoelectric oscillator unit may have small length, that is, its size reduction may be attained. In addition, no gap permitting solder balls to leave is produced.

So long as the amount of paste is adequately controlled, the supports 26 fill the gaps between the inner leads 20 and the electrode films of the piezoelectric oscillator 24, and extend with gradually reducing thickness side from the opposite sides of the inner leads 20 and also upward from the end thereof until they reach the surfaces of the piezoelectric oscillator 24. Thus, the supports have a shape like a hill or mountain. The high temperature solder used in this embodiment is an alloy with a lead content of 90 wt. % or above, the remainder being mainly tin, possibly slightly containing silver. As described before, the inner leads 20 are preliminarily placed with a solder layer 30 of low temperature solder with a lead content of 60 wt. % or below. The volume of the supports 26 is set to at least double, and preferably 5 to 10 times or more, the volume of the inner leads 20, i.e., (surface area of the inner lead 20) by (plating thickness). By so doing, when the low temperature solder preliminarily plated on the inner leads 20 is dissolved in the supports 26, the final composition would have sufficiently high lead content. Desirably, the supports 26 have more volume than the inner leads 20, and their skirt parts extend from the end of the inner leads 20 toward the gravitational center G of the piezoelectric oscillator 24 at least by more than one half of either the diameter, the width or the length of the inner leads 20. These extensions would protect the piezoelectric oscillator 24 by undergoing adequate deformation when a shock is exerted to the piezoelectric oscillator 24. It is thus possible, by setting the final composition of the solder constitution the supports 26 such as to have a high lead content as above, to hold the Young's modulus of the solder within a low value. The Young's modulus tends to be lower when the lead content is higher.

After sealing the cap 28 by pressure fitting the terminal base 10 therein, the system is heat treated. The heat treatment is carried out by heating the system at 80 to 140° C. for 1 to 5 days. In the heat treatment, not only the inner surface of the cap 28 is held in close contact with the solder layer 30, i.e., the soft metal surface layer of the terminal base 10, and mechanically maintains gas tightness, but also copper and nickel as components of the cap 28 are partly alloyed by mutual diffusion with lead and tin in the terminal base side. Thus, the liquid phase line is raised, reflow in the SMD mounting is avoided, and a more reliable seal is obtained.

The low temperature solder plating the metal ring 18 is mostly present on the outer periphery, i.e., the surface of pressure fitting seal with the cap 28. In this portion, a great enough amount of gas as to deteriorate the performance is not generated, even when heating to the melting point, so long as the heating is done for a short period of time, and the seal is held without loosening owing to tightening effect of the cap 28. The low temperature solder plating a ring-like inner surface adjacent to the open cap end is exposed to the inside of the casing. However, the exposed solder area is very slight, and fusion of this solder, if any, would give rise to no substantial adverse effects of gas generation. The low temperature solder plating the inner leads 20 is dissolved in the high temperature solder of the supports 26 when mounting the piezoelectric oscillator 24. Although the supports 26 have a large surface area, they are not fused at the reflow temperature at the time of the mounting, and thus have no substantial adverse effects of gas generation. At the time of the mounting, the high temperature solder paste is thermally fused. However, with high temperature solder the generation of solder balls and solder spatters is very little compared to low temperature solder. Spatters, if any, quickly cool and do not readily attached to the quartz oscillator or the quartz oscillator unit casing inner surfaces.

The effects of the supports of solder on the shock resistance of the piezoelectric oscillator unit will now be considered. In a test of free falling of a cylindrical piezoelectric oscillator unit on a wood floor, the weakest state of the unit, i.e., the state in which the inner piezoelectric oscillator is most readily broken, upon collision of the unit with the floor, is thought to be, in the case where the piezoelectric oscillator is an AT cut, a posture that the main surface (i.e., plate surface) is horizontal, or a posture that the long side of the piezoelectric oscillator is slightly inclined downward toward the free end while the short side is horizontal. In the case where the piezoelectric oscillator is a tuning-fork one, the state most readily subject to leg breakage upon collision, is thought to be a posture that the main surface (i.e., U-shaped surface) is substantially horizontal, or a posture that the main surface is vertical while the longitudinal axis (i.e., symmetry line) is horizontal or slightly inclined downward. The buffering effect of the supports, in the embodiment using the rectangular AT Cut oscillator, will now be considered numerically by taking two examples of solder, different in composition and in Young's modulus.

Referring to FIGS. 2 to 4, the supports 26 as shown have an ideal shape. Actually, the supports 26 are slightly rounded instead of being sharply frustum of pyramid as shown. Their plan shape is considerably accurate, because they follow the deposited electrode patterns formed on the surface of the piezoelectric oscillator 24. Their sectional shape is slightly irregular depending on the solder paste amount. The supports 26 have a shape such that they enclose inner leads 20 which are substantially in contact with the piezoelectric oscillator 24, and extend in a skirting fashion with reducing thickness from an apex side spaced apart from the piezoelectric oscillator 24 to terminate in the same. The piezoelectric oscillator 24 thus have its opposite sides supported by the supports 26. The piezoelectric oscillator 24 is consists of three successive sections A, B and C independence on its dynamic character, particularly rigidity, from its end adjacent the terminal base 10 toward its gravitational center G (or centroid). The section A extends up to a position corresponding to the end of the inner leads 20, and acts as a rigid portion. The section B corresponds to the skirting solder portions, and is of varying rigidity. This section has portions which are considerably lower in rigidity than the section A and are somewhat elastic to provide buffering action against a force or a moment due to a shock tending to cause flexing of the piezoelectric oscillator 24 in directions 8 perpendicular to the quartz plate surface. The section C provides a spring character with flexing of the quartz plate itself caused by the momentum of the total mass of the piezoelectric oscillator 24. In the following consideration, the total mass of the piezoelectric oscillator is regarded to be concentrated on its gravitational center, and the other portions of the piezoelectric oscillator than the gravitational center is ignored.

In this embodiment, the diameter of the inner leads 20 is about 0.3 mm, the length of the sections A and B is 0.25 mm, and the length of the section C up to the gravitational center of the piezoelectric oscillator 24 is 2.5 mm. The frequency is 8 MHz, the total length of the piezoelectric oscillator 24 is 6 mm, and the width thereof is 1.6 mm. It is assumed that the maximum thickness of the piezoelectric oscillator 24 at the center (i.e., gravitational center G) thereof is 0.212 mm, the thickness of the opposite ends is 0.123 mm, and the thickness at the interface between the sections B and C is 0.150 mm. It is also assumed that the opposite side surfaces are cylindrical surfaces drawn by a quadratic curve with the apex at the center.

The thickness y of the piezoelectric oscillator 24 is given as $$2d=y=-0.00992 \times (-3)^2 + 0.212 \text{ (mm)} \tag{1}$$

The volume of the piezoelectric oscillator 24 is calculated by integrating the above curve and multiplying the integral by the width, and it is 1.7494 mm$^3$. Thus, assuming the density of the quartz to be 2.65 mg/mm$^3$, the mass m is calculated to be m=4.636 mg. The quadratic moment Iq of the piezoelectric oscillator 24 in a given section thereof is $$Iq=bd^3/12 \text{ (mm}^4\text{)} \tag{2}$$

FIG. 4 is a section taken along line IV—IV in FIG. 2, i.e., a section of the supports 26 and the piezoelectric oscillator 24, i.e., the section B thereof, in this embodiment. It is assumed that the section B undergoes bending deformation about a neutral plane 32, which passes through the center of the piezoelectric oscillator 24 in the thickness thereof. Strictly speaking, this assumption is not accurate since the supports 26 are not symmetrical in position and shape with respect to the neutral plane 32, but it is made for the sake of the convenience of calculation. As other dimensions used for the calculation, the width of a calculation error is small with the foot where the solder has a small thickness and spring effects are realized the apex of the supports 26 is a=0.1 mm, the width c of the skirts is c=1 mm, and the width b of the piezoelectric oscillator 24 is b=1.6 mm (as noted before). The half thickness of the piezoelectric oscillator 24 is denoted by d (m), the width of the upper side of the solder section by z, and the distance thereof from the neutral plane by e. It is further assumed that z varies linearly between a and c along the skirts of solder. This line passes through the secured end of the piezoelectric oscillator 24. The quadratic moment Is of the supports 26 on both sides of the piezoelectric oscillator 24, in a given section of the section B, is given as $$Is = 2 \int_d^e y^2 z \, dy \frac{[c(3d^4 - 4d^3e + e^4) + z(3e^4 - 4e^3d + d^4)]}{6(e-d)} \text{(mm}^4\text{)} \tag{3}$$

In the section B, the section from x=0.25 mm to x=0.5 mm is uniformly divided into five divisions to take the six cross sections, and d, Iq and Is are obtained for each cross section using the equations (1) to (3). The Young's modulus of quartz is denoted by Eq, the Young's modulus of the low temperature solder, for example one with a tin content of 96% and a lead content of 0.05%, is denoted by Es1, and the Young's modulus of the high temperature solder, for instance one with a lead content of 89.5% and a tin content of 8%, is denoted by Es2. These values are Eq=73.0 GPa (i.e., 7,454 kgf/mm$^2$), Es1=42.1 GPa (i.e., 4,300 kgf/mm$^2$) and Es2=15.7 GPa (i.e., 1,600 kgf/mm$^2$). Iq and Is for each cross section are multiplied by these values. Among the subscripts, q represents quartz, s represents support, 1 represents low temperature solder, and 2 represents high temperature solder. The gravitational center position G of the piezoelectric oscillator 24 is multiplied by virtual load W of W of 9.8 N (i.e., 1 kgf) applied to it in a direction perpendicular to the quartz plate surface. (It is assumed that the crystal oscillator and the support system undergo displacement in proportion to the load, and are not ruptured.) The bending moment acted on a cross section under consideration due to the load is denoted by M. The skirt section B of solder is as short as 0.25 mm and as far as about 2.5 mm away from the gravitational center of the quartz oscillator. It is thus assumed that the bending moment M acting on the section B is substantially uniform and M=24.5 N mm (i.e., 2.5 kgf·mm).

Thus, $1/\rho = di/dx$ in a certain cross section is $$1/\rho = di/dx = M/(EqIq + EsIs) \tag{4}$$

where is the radius (mm) of curvature of the bending flexing of the neutral plane, and i is the flexing angle (rad.) The total flexing angle is of the section B thus can be obtained by integrating the flexing angle from start point x=0.25 to point x=0.5 of the section B. The integral may be obtained by integrating the values given by the equation (4) in the individual cross sections. The detailed process of calculation is not described. The result of calculation is is1=0.04543 (rad.) with low temperature solder and is2=0.07356 (rad.) with high temperature solder. The displacement δ of the gravitational center of the piezoelectric oscillator caused by the flexing, is obtained by multiplying the flexing angle by the distance l=2.5 mm from the gravitational center, and is δ1=0.11358 (mm) with low temperature solder and δ2=0.18390 (mm) with high temperature solder. It was found that as the spring character of the section B of the supports of solder, the spring constant concerning the gravitational center of the piezoelectric oscillator 24 is Ks1=86.3 N/mm (i.e., 8.8044 kgf/mm) with low temperature solder and Ks2=53.3 N/mm (i.e., 5.4377 kgf/mm). The Young's modules of the high temperature solder is only about 37.2% that of the low temperature solder. Although excellent buffering property improvement with the high temperature solder could thus be expected, in the actual spring constants of the support system, the Young's modulus ratio of the supports was 61.8% or larger. This large ratio is due to the fact that the effect of the high temperature solder over the low temperature solder is made less pronounced by the high Young's modulus quartz intervening as a core between the front and rear solder pieces.

The piezoelectric oscillator itself also has an effect of a buffering spring. The spring constant Kq of this buffering spring is approximately the ratio between the load W of W=9.8 N (i.e., 1 Kgf), applied to the gravitational center G of the piezoelectric oscillator in a direction perpendicular to the quartz place surface, and the displacement of the gravitational center G, caused by consequent bending flexing of the piezoelectric oscillator. The bending flexing may be considered to be contributed by a portion of the section C in FIG. 2 from the end thereof adjacent the section B to the gravitational center. This portion is a cantilever beam of homogenious material but with varying cross-sectional thickness, with the load W acting on its free end. Since this portion is not uniform in cross section, like the above case of obtaining the flexing of the section B, several equidistant sections are taken in the longitudinal direction of the cantilever beam of quartz, and the quadratic moment Iq in each cross section due to the load W and also the bending moment M (being assumed to be uniform in intermediate part of cross section) are obtained. Then, assuming the Young's modulus Eq of quartz to be Eq=73.0 GPa (i .e., 7,454 kgf/mm$^2$), the contribution of the displacement of the gravitational center G to the flexing of each section is obtained using the equation (4) by ignoring the solder material term EsIs. By summing up these contributions, the displacement q of the gravitational center G of the quartz oscillator due to the overall section C thereof of q=1,1948 mm is obtained, along with the spring constant Kq of Kq=8.20 N/mm (i.e., 0.8370 kgf/mm).

Figure 5:
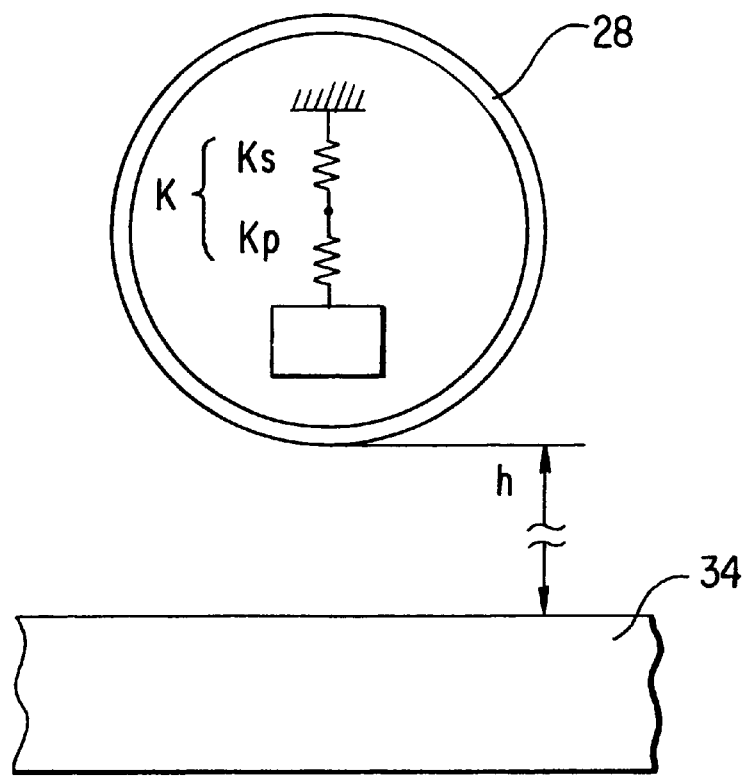
FIG. 5 is a view showing a model for describing behavior of a piezoelectric oscillator unit due to a falling shock exerted thereto.

FIG. 5 is a view showing a model for describing the behavior of a piezoelectric oscillator unit due to a falling shock exerted thereto. The relationship among Kq, Ks and m obtained as in the above and shock resistance, which is the magnitude of stress generated in the quartz oscillator due to a shock exerted thereto, will be described in the following. Referring to FIG. 5, inside the cap 28 of the piezoelectric oscillator unit a spring (with spring constant Ks) which is equivalent to a support spring with one end thereof secured to the casing, and a spring (with spring constant Kq) which is equivalent to the quartz oscillator connected to the other end of the support spring, are provided. Equivalent mass m at the gravitational center of the quartz oscillator is suspended form the other end of the series springs. Denoting the resultant spring constant of the series springs with the spring constants Ks and Kq by K, we have $$1/K=1/Kq+1/Ks \text{ or } K=Kq\ Ks/(Kq+Ks) \quad (5)$$

It is assumed that that this piezoelectric oscillator unit model falls onto a wood plate 34 from a height h in the worst way. In each part of the piezoelectric oscillator unit, position energy corresponding to the height h is changed to kinetic energy corresponding to a collision speed v right before the collision. Upon colliding with the plate, the casing is stopped, but the inner piezoelectric oscillator equivalent mass m continues inertial motion. Thus, the spring K is elongated by s just enough to absorb the kinetic energy of the mass m. When the casing is not stopped by rebounding, the energy to be absorbed by the spring is kinetic energy corresponding to the sum of absolute values of the collision speed and the rebound speed or position energy corresponding to the sum of the fall height and the rebound height. In this case, however, the model and the phenomenon are essentially the same. For the sake of brevity, the following description is made under an assumption that the casing is stopped after the collision. The energy U to be absorbed by the spring K is given as $$U=mgh=(\tfrac{1}{2})mv^2=(\tfrac{1}{2})Ks^2 \quad (6)$$

where g is the gravitational acceleration and g=980 cm/s².

The following calculation concerning the model shown in FIG. 5 is given to quantitatively show the fact that, while fixed kinetic energy of the piezoelectric oscillator due to the falling thereof is absorbed such that it is shared between Kq and Ks, if the spring constant Ks of the support spring is somewhat lower, greater reduction of the energy absorbed with the equivalent spring constant Kq of the piezoelectric oscillator is obtainable, reducing the stress tending to break the oscillator.

From the equation (6) the collision speed v and the maximum gravitational center displacement s are given as $$v=\sqrt{2gh} \text{ or } s=\sqrt{m/K}v \quad (7)$$

The force f generated at the gravitational center position by the displacement s, the moment M acting on the breakage section (as shown by the phantom line in FIG. 3) of quartz due to the force f, and the maximum stress generated in the breakage section of quartz by the momentum M are given as $$f=Ks,\ M=f1,\ \sigma=M/Z \text{ and } Z=by^2/6 \quad (8)$$

where Z is the commonly called section coefficient. In the breakage section of the AT cut plate at 8 MHz in this embodiment, Z=0.006 mm³, if y=0.150 mm. Results of substitution of specific numerical values in this embodiment in the case of m=4.636 mg and h=100 cm are shown below. Subscripts 1 and 2 represent the low and high temperature solder as before.

U=4.54×10−5 j (i.e., 454.29 ergs)
v=442.7 cm/s
K1=7.49 N/mm (i.e., 0.76434 kgf/mm)
K2=7.11 N/mm (i.e., 0.72535 kgf/mm)
s1=0.11018 mm
s2=0.11311 mm
f1=0.825 N (i.e., 0.084215 kgf)
f2=0.804 N (i.e., 0.082044 kgf)
M1=2.06 N mm (i.e., 0.2106 kgf.mm)
M2=2.01 N mm (i.e., 0.2052 kgf.mm)
σ1=344 MPa (i.e., 35.10 kgf/mm²)
σ2=335 MPa (i.e., 34.18 kgf/mm²)

Numerical values of the above necessary calculation results obtained with examples of solder material will now be considered by comparison. As described before, the Young's modulus difference Ks2/Ks1 between low and high temperature solder materials used for the supports (i.e., section B in FIG. 3) was intrinsically large, it is reduced to about 61.8% due to the presence of the hard quartz core material. K1 and K2 were found to be even closer, that is, K2/K1=94.9% because it is normally easier to bend long plates and difficult to bend short plates, although this depends on the from of action of the moment and the thickness of the cross section. Since the quartz plate is sufficiently long, its spring constant Kq is reduced (i.e., its compliance is increased). The section B in FIG. 2 is short and relatively highly rigid, and the numerical values of Ks2 and Ks1 are high. For this reason, the difference in the resultant spring constant K given by the equation (5) is further reduced. In the long run, the difference reduction is due to the fact that the ratio of the obtained displacement s, force f, bending moment M and stress between the two materials, is proportional or inversely proportional to K2/K1. It is thought that the quartz is ruptured upon reaching of a rupture threshold by its stress. For this reason, the comparison of, for instance, stress between different solder materials should be an index of evaluation of the final shock resistance. From the results obtained, we had σ2/σ1=97.4% and a stress ratio of about 2.6%.

As is seen from the above calculated results, the stress can be reduced by several percent by using high lead content solder. The calculated bending stress of quartz in the case of a falling height of 1 m or slightly above as a demand of the market, coincides fairly well with actual bending stress values, obtained by applying static load to quartz oscillator in rupture experiments. This indicates adequacy of the consideration of the shock from the dynamics standpoint as described above. As long as the shock resistance of the piezoelectric oscillator is almost the market's greatest need, a stress improvement of even several percent greatly contributes to the reliability of the product, and is highly worthwhile in the industry.

Experiments conducted by the inventor's company showed that impact resistance property, which corresponded to a falling height of about 75 cm in the case of using high temperature solder, was greatly improved corresponding to a falling height of up to 1.2 or 1.5 m by using high temperature solder. Aside from the above calculation, the use of high lead content solder has two effects permitting great improvement of the shock resistance.

The first effect is based on the stress-strain characteristic of solder. In a tension test conducted on solder test pieces, the increment of the tensile stress is not substantially proportional to the elongation strain but is reduced monotonously with strain increase, thus drawing a curve resembling the positive part of a logarithmic curve. This shape indicates that the Young's modulus is lower when the strain is greater, and also indicates that the material probably has a hysteresis concerning the recurring deformation and is subject to high internal loss. The Young's modulus used in the above calculation is a value obtained from the trend of a curve in a very initial stage of deformation, and from the above calculation it was found that with a strain of several percent, which is the maximum strain caused in the solder supports (section B) by a fall by 1 m, the mean Young's modulus is reduced to one half or less of the initial value. The reducing trend is similar with low temperature solder (close to tin) and high temperature solder. When the strain is high, the mean Young's modulus of high temperature solder is still considerably lower.

Figure 6:
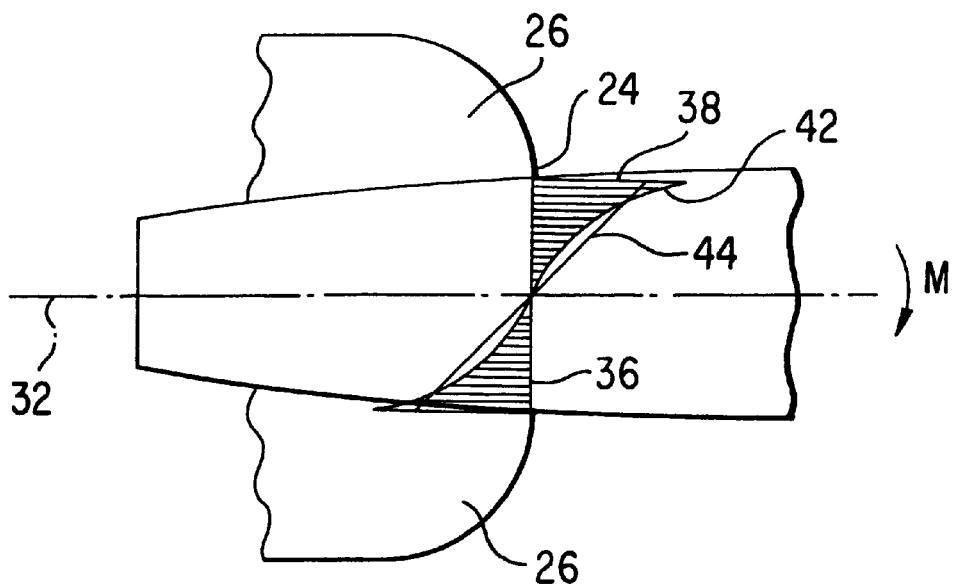
FIG. 6 is a fragmentary sectional view for describing the stressed status of solder edges.

The second effect is attributable to the difference in the stress concentration effect. FIG. 6 is a sectional view showing the edge of skirt part of support 24 and a neighboring part of piezoelectric oscillator 24 in the unit embodying the invention. Reference numeral 38 designates stress distribution on both sides of the neutral plane 32 brought about by bending moment M in a cross section 36 perpendicular to the axis of the piezoelectric oscillator 24 at the skirt edge position. In many piezoelectric oscillators actually produced, the support 25 terminates sharply just like a dome, instead of having a skirt as shown in FIG. 6. In such a case, it is estimated that when the piezoelectric oscillator 24 is bent, the rigidity of the supports 26 causes stress concentration in the neighborhood of the oscillator surface at the corners, so that the stress in the cross section 36 is distributed such that it is actually more increased at the surface as shown by curved stress distribution, instead of linear stress distribution 42 as shown by the straight line, which would be the case if the supports 26 were absent. The commonly used text "Mechanical Engineering Handbook" teaches that for a round rod with a step experiencing bending while being rotated, the limit fatigue (i.e., maximum stress not resulting in fatigue rupture with infinite times of recurrent load changes) is reduced due to stress concentration in the corners compared to the limit fatigue of a uniform diameter round rod equal in diameter to the small diameter portion of the round rod with step. This reduction factor exceeds 1.0, and reaches as high as 2.5 in the case where the corners have small radius of curvature and are sharp because, when bending is exerted, the maximum stress is actually increased with the above factor at the corners. Similar increase may be brought abut by a single time of load application. The stress distribution as shown in FIG. 6 is can be presumed from the teachings of the above handbook.

This embodiment, however, is set apart in that the material is discontinuous, that is, a step shape is constituted by the different materials of solder and quartz, the hard quartz being wrapped in the soft solder. For this reason, the reduction factor may be less than the value calculated using the above handbook. It is supposed that the actual reduction factor may be the product of the reduction factor of 2.5 in the case of the homogenious material and the Young's modulus ratio Es/Eq between solder and quartz (which is 0.577 with low temperature solder and 0.215 with high temperature solder), but it may not be less than 1. Under this supposition, the product of the above reduction factor of 2.5 and the Young's modulus ratio of the low temperature solder is 1.44.

This means stress is considerably increased. By using the high temperature solder, however, the reduction factor is 1 (this being made so since the product is 0.538<1). This means zero stress concentration. In other words, the intrinsic mechanical strength of quartz can be fully exhibited, and marked improvement of effect is obtainable.

Adding the above information to the concept underlying the above calculation, leads to the following. With either low or high temperature solder, as deformation of the supports proceeds in the process of a shock, the Young's modulus is reduced to cause greater deformation than the above calculated value, thus reducing the equivalent spring constant Ks and the stress in quartz. With high lead content solder, however, it is expected that more strain is generated with deformation of the supports, causing greater reduction of the Young's modulus and increasing the final deformation, so that the ratio of the stress in quartz with respect to that in the case of low temperature solder is greater than the previous calculation result of 2.6 percent. Furthermore, in addition to the effect accompanying the Young's modulus reduction, a buffering effect will also be provided, which is attributable to dissipation of the elastic hysteresis, i.e., internal energy loss, of solder by converting part of the oscillation energy generated by a shock to heat. Although quantitative difference of effect with different solder materials is not clear at present, it is supposed that greater effect is obtainable with high lead content solder, which is known as material capable of being readily plastically deformed.

Figure 7:
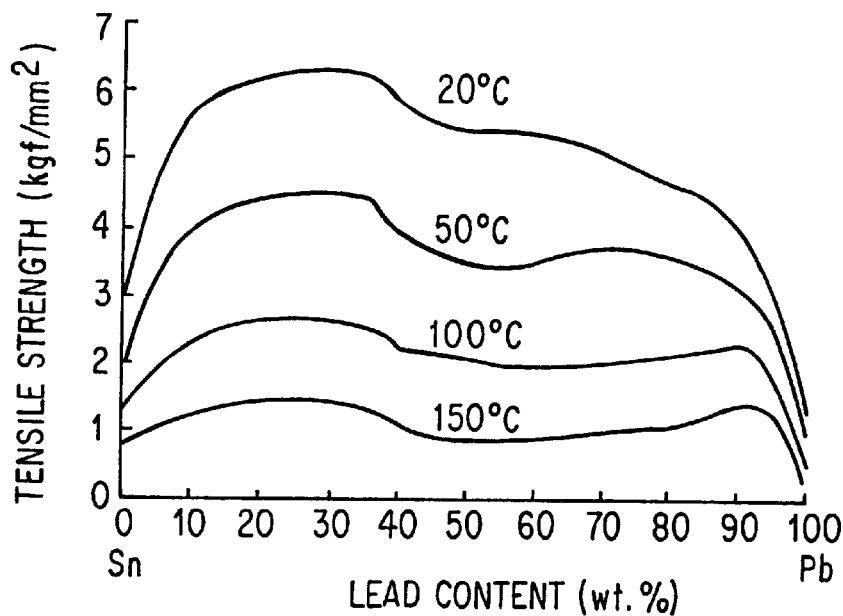
FIG. 7 is a graph showing the relationship among the composition, temperature and tensile strength of solder.
Figure 8:
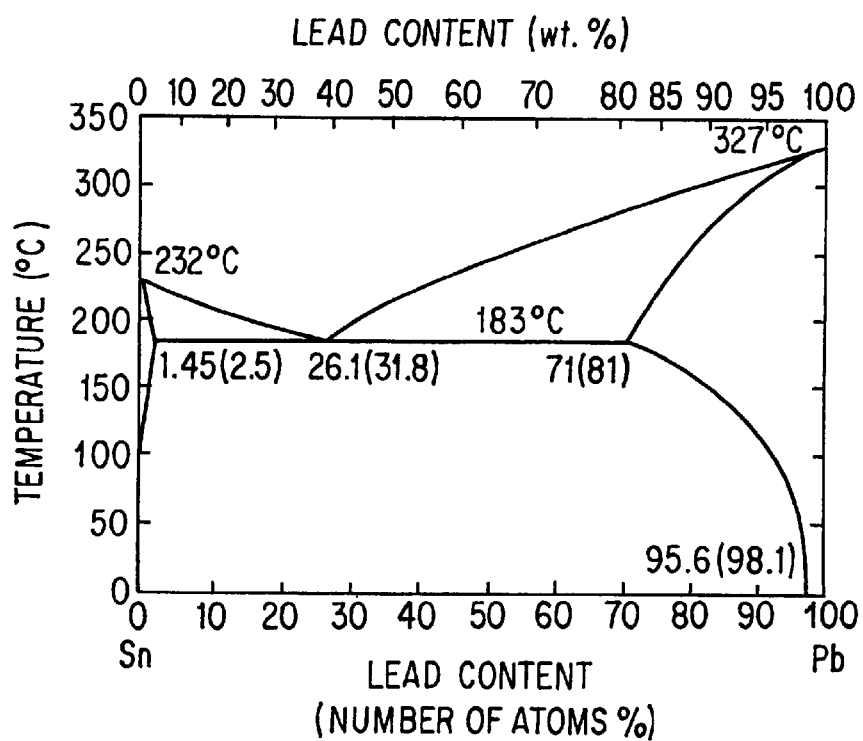
FIG. 8 is a binary diagram of tin-lead alloy.

Example compositions and characteristics of the solder materials used according to the present invention will next be described in detailed. FIG. 7 is a graph showing the tensile strength plotted against the lead content by weight of solder, with the temperature taken as the third parameter. FIG. 8 is a binary state diagram of tin-lead alloy. The low temperature solder for preliminarily plating the terminal base and leads of the piezoelectric oscillator unit, adequately has a composition such that its melting point (position of liquid phase line in FIG. 8) is about 232° C., i.e., the melting point of pure tin, or below, that is, has a lead content of 0 to 60 wt. %. However, alloys with lead contents of 40 to 80 wt. % are rather difficult to use. High temperature solder selectable for supporting the piezoelectric oscillator may contain up to 100 wt. % of lead, but the lead content after the cooling is selected to about 85 to 79 wt. % by taking the fusing and blending, with high temperature solder, of low temperature solder plating the inner leads at the time of the mounting into considerations. The lower limit lead content of 85 wt. % is such that the solid phase line shown in FIG. 8 is not below the melting point of pure tin. The upper limit of 97 wt. % is set as such in order that the supports of the piezoelectric oscillator maintains certain mechanical strength even when heated after completion of the sealing.

Figure 9:
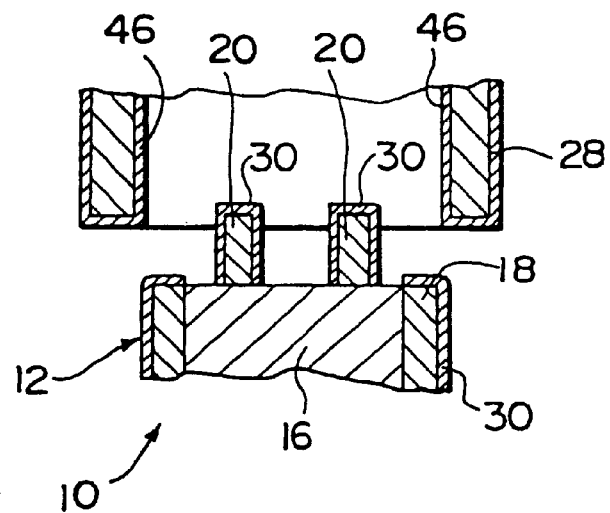
FIG. 9 is a view showing an essential part of a second embodiment of the present invention.

FIG. 9 shows an essential part of a different embodiment of the present invention. In the description of this embodiment, parts like those in the preceding embodiment are designated by like reference numerals and not described. A feature of this embodiment resides in that a solder layer 46 of low temperature solder is provided on the cap 28 as well. The solder layer 46 is provided at least on the inner surface of an open end portion of the cap. For the remainder of the structure, the embodiment is the same as the previous embodiment.

By pressure fitting, the low temperature solder plating the metal ring 18 and that plating the inner surface of the cap 28 are brought into forced contact with each other and effect gas-tight sealing in cooperation with each other. The total thickness of the soft metal layers of solder is, for instance, about 15 μmm, and this thickness can be shared, for instance in a fifty-to-fifty ratio, between the terminal base 10 and the cap 28. This means hat the plating thickness of low temperature solder on the terminal base 10 may be several μm. Thus, the thickness of plating on the inner leads 20 may be substantially equally reduced. In other words, after the piezoelectric oscillator is mounted, the lead content in the supports 26 of high temperature solder is less reduced by the dissolving of low temperature solder in the supports 26. The Young's modulus increase of the supports 26 thus can be held within less extent. However, if the piezoelectric oscillator unit is heated to a temperature above the melting point of the low temperature solder when mounting the piezoelectric oscillator on the circuitry substrate, although the sealing surfaces in forced contact with each other maintain gas tightness with the tightening effect irrespective of the fusing of solder, evaporation of low temperature solder remaining in the cap inner surface would result to deteriorate the characteristics of the piezoelectric oscillator unit. Therefore, a certain limit is imposed on the overall heat resistance of the structure according to the present invention. The structure, however, is considerably robust against the heating of the outer leads, because the heat conduction terminates in high temperature solder.

Figure 10:
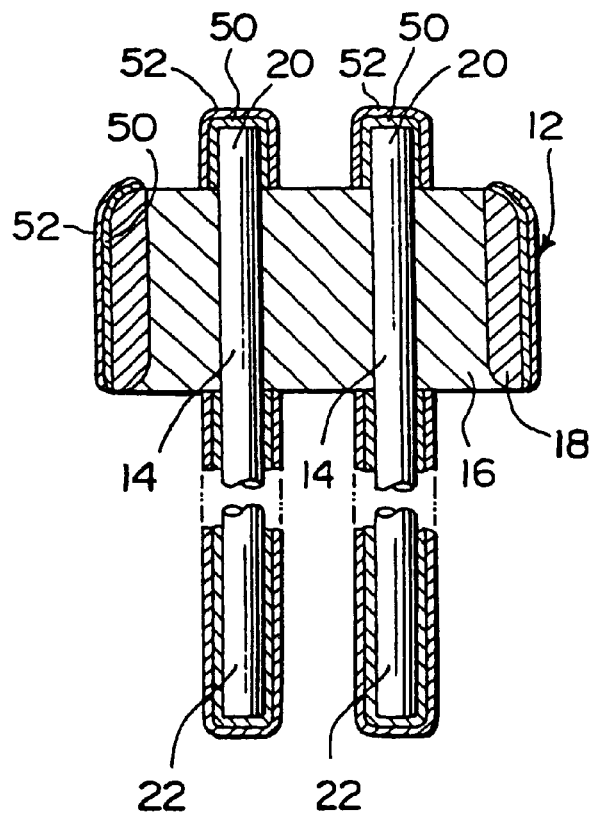
FIG. 10 is a view showing an essential part of a third embodiment of the present invention.

FIG. 10 shows an essential part of a further embodiment of the present invention. Again in the description of this embodiment, parts like those in the preceding embodiments are designated by like reference numerals and not described. A feature of this embodiment resides in that the terminal base is plated with two different solder layers. For the remainder of the structure, the embodiment is the same as the previous embodiments.

As is shown in the Figure, a first solder layer 50 of high temperature solder and a second solder layer 52 of low temperature solder are provided on the outer periphery of the metal ring 18 and exposed portions of the leads 14, i.e., the inner and outer leads 20 and 22. As described before, the high temperature solder is one with lead content of 60 wt. % or above. In this embodiment, the first solder layer 50 is formed from solder with a lead content of 90 wt. % or above. The plating thickness of the first solder layer 50 is about 9 to 15 μm. The second solder layer 52 of low temperature solder is formed to a thickness of about 3 to 5 μm on the first solder layer 50. The low temperature solder, as described above, is one with a lead content of 60 wt. % or below. The low temperature solder used in this embodiment has a lead content of about 40 wt. % or below, that is, it has a composition near the eutectic point. This composition is selected for such reasons as that solder with a lead content exceeding 40 wt. %, would have a soldering property, be soft and readily damaged, have a blackish color and be undesirable from an aesthetic standpoint, and would require stringent plating liquid composition control. It is suitable to form a copper plating layer to a thickness of 2 to 5 μm prior to the formation of the two solder layers 50 and 52 on the surface of the leads 14 and the metal ring 18. Doing so will improve the close contact between Kovar, i.e., the material of the leads 14 and the metal ring 18, and solder. It is also suitable to plate the surface of the first solder layer 50 with an intermediate layer of a metal with a higher melting point than lead, such as nickel, copper, gold, etc., to a thickness of about 1 μm. Doing so has an effect of preventing diffusion of lead from the first solder layer 50 into the second solder layer 52.

As in the previous embodiments, the piezoelectric oscillator is secured by soldering to the inner leads. The soldering is made in a reflow furnace at a temperature of, for instance, 300° C. In the soldering, the high temperature solder plating the inner leads is fused to break the thin nickel film and be dissolved, together with outer low temperature solder, in the high temperature solder for the mounting, and these solder materials are cooled down and solidified together. In experiments, heat resistance improvement was recognized even when the final lead content of the supports is 77 wt. %, but for attaining improvement of both the heat resistance and the shock resistance, it is desirable to obtain a composition closer to the intrinsic high temperature solder composition (for instance containing 90 wt. % of lead, 8 wt. % of tin and 2 wt. % of silver). Owing to the composition of the first solder layer 50 on the inner leads, the lead content in the final composition of the solder mass is less reduced, so that it is possible to more readily attain the above object.

The terminal base 10 shown in FIG. 10 can find very extensive applications as gas-tight sealer terminal as sealing parts of electronic devices. That is, owing to the first solder layer 50 of high temperature solder, the terminal base is applicable to cases where high heat resistance is required. Of course the terminal base is applicable for general purposes.

In the above embodiments, the piezoelectric oscillator may be of any other type, for instance tuning-fork piezoelectric oscillator, as well without substantial changes in the obtainable effects. In addition, the piezoelectric oscillator may be secured at both ends according to the internal structure. Furthermore, the leads of the gas-tight sealer terminal may not be of the circular sectional profile. Still further, the inner leads may not be in the opposite sides of the piezoelectric oscillator, but may be disposed side by side on one side of the piezoelectric oscillator for supporting the piezoelectric oscillator via solder. In this case, since the supports are provided on one side of the piezoelectric oscillator, the compliance can be reduced, thus providing more pronounced effect of using the high temperature solder. Still further, the terminal base of Kovar or the like may be preliminarily plated with a ground layer of copper or the like before the plating with solder. Still further, the cap may be formed from materials more inexpensive than german silver, for instance iron, ion alloys, aluminum, aluminum alloys, copper, SUS and copper-nickel-tin alloys (with or without plating with nickel or like material).

As has been described above, the supports supporting the piezoelectric oscillator have a large volume, so that the lead content will be sufficient, thus providing such heat resistance that it can be mounted in SMD. In addition, the high lead content of the supports permits a great buffering effect to be obtained by the overall action of the low Young's modulus, non-linear reduction thereof, alleviation of the internal friction and stress concentration and so forth. A high degree of shock resistance thus could be obtained in the experimental data. This effect eliminated the positional deviation in the mounting using adhesive for buffering in the prior art, and reduced fluctuations of CI (equivalent resistance at the time of the resonance) and Co (inter-electrode capacitance). Furthermore, unlike the prior art, no intermediate buffering part need be attached to the inner leads, so that it is possible to avoid complication of structure, assembling cost increase, increase of the total length of the piezoelectric oscillator, remaining solder balls and so forth. Because high temperature solder is used for supporting the piezoelectric oscillator, spattering and attachment of solder can be eliminated.

Where the terminal base (i.e., gas-tight sealer terminal) is placed by two-layer plating with high temperature solder as an inner layer and low temperature older as an upper layer, the structure could directly maintain satisfactory property of soldering the piezoelectric oscillator with the outer leads.

Unlike the prior art, it was possible to dispense with removal of plating layer of high lead content solder and preclude the difficulty of the process of bending leads and the re-mounting process in the prior art case, in which silver requiring high material cost is used to place surface (thinly). Furthermore, it was possible to further improve the lead content of solder mass by the dissolving of the plating solder of the inner leads in the mass. The two-layer plating may be carried out in a simple process with two plating baths disposed in series, and does not substantially lead to cost increase.

Moreover, where the inner surface of the cap is not plated with solder or like low melting point soft metal or plated with nothing, it is possible to practically eliminate generation of metal vapor from the inside of the piezoelectric oscillator unit when the same is heated, and thus realize a piezoelectric oscillator unit having heat resistance suited for being mounted on an SMD.

What is claimed is:

1. A piezoelectric oscillator unit comprising:

a piezoelectric oscillator;

a cap having a substantially cylindrical shape open at one end, for accommodating said piezoelectric oscillator;

a gas-tight sealer terminal sealing the open end of said cap and forming a gas-tight casing together with said cap, said gas-tight sealer terminal including a plug having substantially the same cross-sectional profile as the inner diameter of the open end of said cap and having a first layer formed from solder with a lead content of 60 percent by weight or less or from tin or a tin alloy, on a portion in contact with the inner surface of the open end of said cap, and a plurality of leads penetrating said plug, each lead having an outer lead surface, and each said lead further comprising a second layer formed from solder with a lead content of 60 percent by weight or less or from tin or a tin alloy, on portions extending from the plug; and supports formed from solder with a lead content between 85 and 98 percent by weight, for bonding and securing said piezoelectric oscillator to inner leads as portions of said leads extending into said gas-tight casing, and wherein said solder with a lead content between 85 and 98 percent by weight at least partially covers said second layers, such that said second layers are located between said solder with a lead content between 85 and 98 percent by weight and said outer lead surfaces.

2. The piezoelectric oscillator unit according to claim 1, wherein said plug further has a third layer formed from solder with a lead content of more than 60 percent by weight, underlying said first layer.

3. The piezoelectric oscillator unit according to claim 2, wherein said plug further has a fourth layer formed from solder with a lead content of more than 60 percent by weight, underlying the second layer on said leads.

4. The piezoelectric oscillator unit according to claim 1, wherein said supports substantially cover said inner leads, and have extensions extending from ends of said leads toward the centroid of said piezoelectric oscillator and having a length greater than one half the diameter of said leads.

5. The piezoelectric oscillator according to claim 1, wherein said cap is formed from a copper-nickel alloy.

6. The piezoelectric oscillator according to claim 1, wherein said cap has a nickel layer formed from nickel on its surface.

7. A piezoelectric oscillator unit comprising a piezoelectric oscillator;

a cap having a substantially cylindrical shape open at one end, for accommodating said piezoelectric oscillator;

a gas-tight sealer terminal sealing the open end of said cap and forming a gas-tight casing together with said cap, said gas-tight sealer terminal including a plug having substantially the same cross-sectional profile as the inner diameter of the open end of said cap and having a layer formed from solder with a lead content of more than 60 percent by weight, on a portion in contact with the inner surface of the open end of said cap, and a plurality of leads penetrating said plug, each lead having an outer lead surface, and each said lead further comprising a second layer formed from solder with a lead content of 60 percent by weight or less or from tin or a tin alloy, on portions extending from the plug; and supports formed from solder with a lead content between 85 and 98 percent by weight, for bonding and securing said piezoelectric oscillator to inner lead portions of said leads extending into said gas-tight casing, and wherein said solder with a lead content between 85 and 98 percent by weight at least partially covers said second layer, such that said second layer is located between said solder with a lead content between 85 and 98 percent by weight and said outer lead surfaces.

8. The piezoelectric oscillator unit according to claim 7, wherein said supports substantially cover said inner leads, and have extensions extending from ends of said leads toward the centroid of said piezoelectric oscillator and having a length greater than one half the diameter of said leads.

9. The piezoelectric oscillator according to claim 7, wherein said cap is formed from a nickel-copper alloy.

10. The piezoelectric oscillator according to claim 7, wherein said cap has a nickel layer formed from nickel on its surface.

* * * * *